US012597479B2

(12) United States Patent
Park

(10) Patent No.: US 12,597,479 B2
(45) Date of Patent: Apr. 7, 2026

(54) SEMICONDUCTOR DEVICE

(71) Applicant: SK hynix Inc., Icheon-si (KR)

(72) Inventor: Young Jun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 95 days.

(21) Appl. No.: 18/771,019

(22) Filed: Jul. 12, 2024

(65) Prior Publication Data

US 2025/0292854 A1 Sep. 18, 2025

(30) Foreign Application Priority Data

Mar. 14, 2024 (KR) ........................ 10-2024-0036098

(51) Int. Cl.
  *G11C 16/08* (2006.01)
  *G11C 29/12* (2006.01)
  *G11C 29/18* (2006.01)
(52) U.S. Cl.
  CPC .......... *G11C 29/18* (2013.01); *G11C 29/1201* (2013.01); *G11C 29/12015* (2013.01); *G11C 16/08* (2013.01)
(58) Field of Classification Search
  CPC ...................................................... G11C 16/08
  See application file for complete search history.

(56) References Cited

U.S. PATENT DOCUMENTS

2009/0222617 A1* 9/2009 Yano ........................ G06F 3/064
                                                                    711/170
2020/0111537 A1 4/2020 Chen et al.

FOREIGN PATENT DOCUMENTS

KR 1020140139928 A 12/2014

* cited by examiner

*Primary Examiner* — Jason Lappas
(74) *Attorney, Agent, or Firm* — WILLIAM PARK AND ASSOCIATES LTD.

(57) ABSTRACT

A semiconductor chip includes a command address input circuit configured to generate a rising command address and a falling command address by receiving an external command address and configured to output the rising command address and the falling command address to a through electrode, and a test circuit configured to generate a detection signal by latching a remaining one of the rising command address and the falling command address as any one of the rising command address and the falling command address and configured to detect a fail in the transmission of the rising command address and the falling command address by detecting the logic level of the detection signal.

20 Claims, 11 Drawing Sheets

| CAR<1> | CAR<2> | DT<1> | DT<2> | DETECTION RESULT |
|--------|--------|-------|-------|------------------|
| L | L | L | L | PASS |
|  |  | L | H | FAIL |

SEMICONDUCTOR DEVICE

CROSS-REFERENCE TO RELATED APPLICATION

The present application claims priority under 35 U.S.C. § 119(a) to Korean Patent Application No. 10-2024-0036098, filed in the Korean Intellectual Property Office on Mar. 14, 2024, the entire contents of which application is incorporated herein by reference.

BACKGROUND

1. Technical Field

Various embodiments of the present disclosure generally relate to a semiconductor device, and more particularly, to a semiconductor device including a semiconductor chip configured to detect a fail in the transmission of a command address that is output through a signal path.

2. Related Art

As a technology for manufacturing a semiconductor chip is developed, a packaging technology for a plurality of memory chips for implementing the semiconductor chip includes gradually increasing the integration degree and the performance of the semiconductor chip. In packaging technologies for implementing the semiconductor chip, a technology relating to a three-dimensional structure in which a plurality of memory chips are vertically stacked out of the two-dimensional structure in which a plurality of memory chips are flatly disposed on a printed circuit board (PCB) is variously developed. The semiconductor chip having the three-dimensional structure may be implemented by stacking a plurality of memory chips through a through silicon via (TSV) (hereinafter referred to as a "through electrode") or may be implemented by stacking a plurality of memory chips through wire bonding, like high bandwidth memory (HBM).

The plurality of memory chips perform an operation by receiving a command address that controls an operation of the memory chips through a plurality of through electrodes. When a fail occurs in the transmission of the command address that is received through the plurality of through electrodes, there is a need for an operation of detecting the fail in the transmission of the command address because all of the plurality of memory chips are treated as a fail.

SUMMARY

In an embodiment, a semiconductor chip may include a command address input circuit configured to generate a rising command address and a falling command address by receiving an external command address and configured to output the rising command address and the falling command address to a through electrode, and a test circuit configured to generate a detection signal by latching the remaining one of the rising command address and the falling command address as any one of the rising command address and the falling command address and configured to detect a fail in the transmission of the rising command address and the falling command address by detecting the logic level of the detection signal.

In an embodiment, a semiconductor chip may include a command address input circuit configured to generate first and second rising command addresses and first and second falling command addresses by receiving first to fourth external command addresses and configured to output the first and second rising command addresses and the first and second falling command addresses to a through electrode, and a test circuit configured to generate first and second detection signals by latching the remaining one of the first and second rising command addresses and the first and second falling command addresses as any one of the first and second rising command addresses and the first and second falling command addresses and configured to detect a fail in the transmission of the first and second rising command addresses and the first and second falling command addresses when the first and second detection signals are different from a set value.

BRIEF DESCRIPTION OF THE DRAWINGS

FIG. 1 is a block diagram illustrating a construction of a semiconductor chip according to an embodiment of the present disclosure.

FIG. 5 is a timing diagram for describing an embodiment of an operation of a command address input circuit that is included in the base chip illustrated in FIG. 2.

FIG. 6 is a block diagram illustrating a construction according to an embodiment of a test circuit that is included in the base chip illustrated in FIG. 2.

FIG. 9 is a table for describing an operation of detecting, by the semiconductor chip according to an embodiment of the present disclosure, a fail in the transmission of a command address.

DETAILED DESCRIPTION

Figure 2:
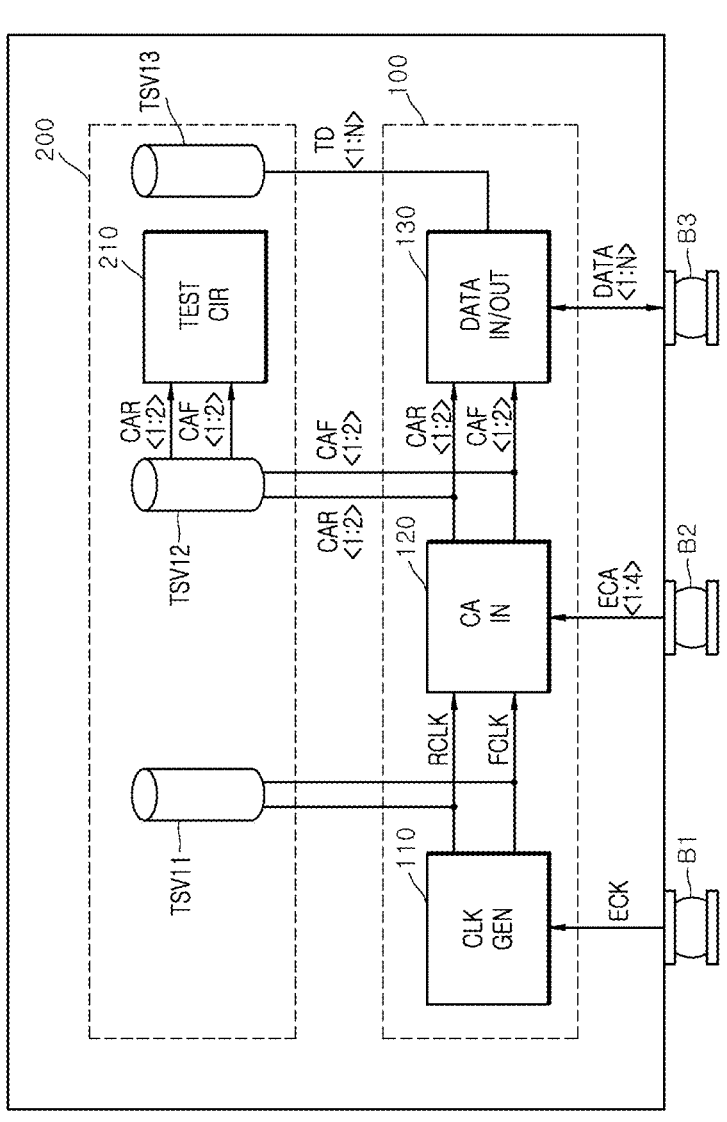
FIG. 2 is a block diagram illustrating a construction according to an embodiment of a base chip that is included in the semiconductor chip illustrated in FIG. 1.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

Figure 1:
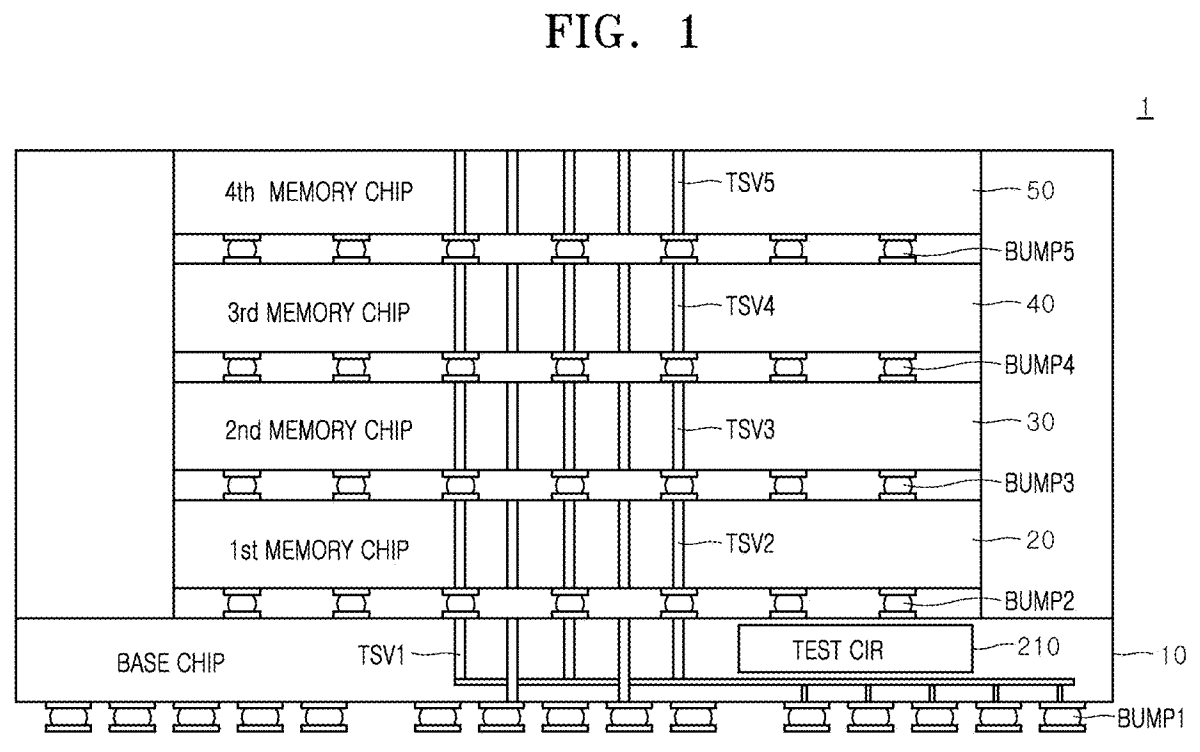

As illustrated in FIG. 1, a semiconductor chip 1 according to an embodiment of the present disclosure may include a base chip 10, a first memory chip 20, a second memory chip 30, a third memory chip 40, and a fourth memory chip 50.

The base chip 10 may be electrically connected to a first bump BUMP1, a second bump BUMP2, and a first signal path TSV1. The first bump BUMP1, the second bump BUMP2, and the first signal path TSV1 may be electrically connected.

The base chip 10 may include a test circuit (TEST CIR) 210.

The test circuit 210 may be included in a through electrode area (200 in FIG. 2) including a plurality of through electrodes. The test circuit 210 may generate detection signals (DT<1:2> in FIG. 6) by latching the remaining one of rising command addresses (CAR<1:2> in FIG. 2) and falling command addresses (CAF<1:2> in FIG. 2) as any one of the rising command addresses (CAR<1:2> in FIG. 2) and the falling command addresses (CAF<1:2> in FIG. 2). The test circuit 210 may detect a fail in the transmission of the rising command addresses (CAR<1:2> in FIG. 2) and the falling command addresses (CAF<1:2> in FIG. 2) by detecting the logic levels of the detection signals (DT<1:2> in FIG. 6). When the detection signals (DT<1:2> in FIG. 6) are different from a set value, the test circuit 210 may detect that a fail in the transmission of the rising command addresses (CAR<1:2> in FIG. 2) and the falling command addresses (CAF<1:2> in FIG. 2) has occurred.

The base chip 10 may generate the detection signals (DT<1:2> in FIG. 6) by latching the remaining one of the rising command addresses (CAR<1:2> in FIG. 2) and the falling command addresses (CAF<1:2> in FIG. 2) as any one of the rising command addresses (CAR<1:2> in FIG. 2) and the falling command addresses (CAF<1:2> in FIG. 2). The base chip 10 may detect a fail in the transmission of the rising command addresses (CAR<1:2> in FIG. 2) and the falling command addresses (CAF<1:2> in FIG. 2) by detecting the logic levels of the detection signals (DT<1:2> in FIG. 6).

The first memory chip 20 may be electrically connected to the second bump BUMP2, a third bump BUMP3, and a second signal path TSV2. The second bump BUMP2, the third bump BUMP3, and the second signal path TSV2 may be electrically connected. The first memory chip 20 may be stacked on the base chip 10 through the second bump BUMP2 and the second signal path TSV2. The first memory chip 20 may be electrically connected to the base chip 10 through the second bump BUMP2 and the second signal path TSV2. The first memory chip 20 may be electrically connected to the second memory chip 30 through the second signal path TSV2 and the third bump BUMP3.

The first memory chip 20 may store transfer data (TD<1:N> in FIG. 2) that are input from the base chip 10 after the start of a write operation. The first memory chip 20 may output the transfer data (TD<1:N> in FIG. 2) that have been stored in the first memory chip 20 to the base chip 10 after the start of a read operation.

The second memory chip 30 may be electrically connected to the third bump BUMP3, a fourth bump BUMP4, and a third signal path TSV3. The third bump BUMP3, the fourth bump BUMP4, and the third signal path TSV3 may be electrically connected. The second memory chip 30 may be stacked on the first memory chip 20 through the third bump BUMP3 and the third signal path TSV3. The second memory chip 30 may be electrically connected to the first memory chip 20 through the third bump BUMP3 and the third signal path TSV3. The second memory chip 30 may be electrically connected to the third memory chip 40 through the third signal path TSV3 and the fourth bump BUMP4.

The second memory chip 30 may store the transfer data (TD<1:N> in FIG. 2) that are input from the base chip 10 after the start of a write operation. The second memory chip 30 may output the transfer data (TD<1:N> in FIG. 2) that have been stored in the second memory chip 30 to the base chip 10 after the start of a read operation.

The third memory chip 40 may be electrically connected to the fourth bump BUMP4, a fifth bump BUMP5, and a fourth signal path TSV4. The fourth bump BUMP4, the fifth bump BUMP5, and the fourth signal path TSV4 may be electrically connected. The third memory chip 40 may be stacked on the second memory chip 30 through the fourth bump BUMP4 and the fourth signal path TSV4. The third memory chip 40 may be electrically connected to the second memory chip 30 through the fourth bump BUMP4 and the fourth signal path TSV4. The third memory chip 40 may be electrically connected to the fourth memory chip 50 through the fourth signal path TSV4 and the fifth bump BUMP5.

The third memory chip 40 may store the transfer data (TD<1:N> in FIG. 2) that are input from the base chip 10 after the start of a write operation. The third memory chip 40 may output the transfer data (TD<1:N> in FIG. 2) that have been stored in the third memory chip 40 to the base chip 10 after the start of a read operation.

The fourth memory chip 50 may be electrically connected to a fifth bump BUMP5 and the fifth signal path TSV5. The fifth bump BUMP5 and the fifth signal path TSV5 may be electrically connected. The fourth memory chip 50 may be stacked on the third memory chip 40 through the fifth bump BUMP5 and the fifth signal path TSV5. The fourth memory chip 50 may be electrically connected to the third memory chip 40 through the fifth bump BUMP5 and the fifth signal path TSV5.

The fourth memory chip 50 may store the transfer data (TD<1:N> in FIG. 2) that are input from the base chip 10 after the start of a write operation. The fourth memory chip 50 may output the transfer data (TD<1:N> in FIG. 2) that have been stored in the fourth memory chip 50 to the base chip 10 after the start of a read operation.

The first bump BUMP1, the second bump BUMP2, the third bump BUMP3, the fourth bump BUMP4, and the fifth bump BUMP5 may each be implemented in the form of a ball that is implemented by using a conductive material in order to be directly connected to a circuit board. The first bump BUMP1, the second bump BUMP2, the third bump BUMP3, the fourth bump BUMP4, and the fifth bump BUMP5 may each be implemented to include a plurality of bumps. The first signal path TSV1, the second signal path TSV2, the third signal path TSV3, the fourth signal path TSV4, and the fifth signal path TSV5 may each be implemented as a through electrode that is implemented as a through silicon via (TSV). The first signal path TSV1, the second signal path TSV2, the third signal path TSV3, the fourth signal path TSV4, and the fifth signal path TSV5 may each be implemented to include a plurality of through electrodes.

In FIG. 1, the first to fourth memory chips 20, 30, 40, and 50 have been implemented to be stacked on the base chip 10. However, according to an embodiment, various numbers of memory chips, such as 8 or 16, may be implemented to be stacked on the base chip 10.

The semiconductor chip 1 illustrated in FIG. 1 has been implemented so that the base chip 10 and the first to fourth memory chips 20 to 50 are implemented to be stacked through the through electrodes like high bandwidth memory (HBM). However, according to an embodiment, the semiconductor chip 1 illustrated in FIG. 1 may be implemented so that a plurality of memory chips is implemented to be stacked through wire bonding. The wire bonding may be set as a signal path for signals that are input to and output from the base chip 10 and the first to fourth memory chips 20 to 50 according to an embodiment.

FIG. 2 is a block diagram illustrating a construction according to an embodiment of the base chip 10 that is included in the semiconductor chip 1 illustrated in FIG. 1. The base chip 10 may include an interface area 100 and the through electrode area 200.

The interface area 100 may include a clock generation circuit (CLK GEN) 110, a command address input circuit (CA IN) 120, and a data input and output circuit (DATA IN/OUT) 130. The interface area 100 may be set as an area including circuits for controlling operations of the first to fourth memory chips 20, 30, 40, and 50.

The clock generation circuit 110 may receive an external clock signal ECK through a bump B1. The clock generation circuit 110 may generate a rising clock signal RCLK and a falling clock signal FCLK based on the external clock signal ECK. The clock generation circuit 110 may generate the rising clock signal RCLK including a pulse that is generated in synchronization with a rising edge of the external clock signal ECK. The clock generation circuit 110 may generate the falling clock signal FCLK including a pulse that is generated in synchronization with a falling edge of the external clock signal ECK. The external clock signal ECK may be set as a signal that is periodically toggled in order to synchronize operations of the base chip 10 and the first to fourth memory chips 20, 30, 40, and 50. The clock generation circuit 110 may output the rising clock signal RCLK and the falling clock signal FCLK through a through electrode TSV11. The rising clock signal RCLK and the falling clock signal FCLK may be set as signals that have opposite phases and that are periodically toggled. An operation of generating, by the clock generation circuit 110, the rising clock signal RCLK and the falling clock signal FCLK based on the external clock signal ECK may be described below with reference to FIG. 4.

The command address input circuit 120 may generate the first and second rising command addresses CAR<1:2> and the first and second falling command addresses CAF<1:2> based on first to fourth external command addresses ECA<1:4> in synchronization with the rising clock signal RCLK and the falling clock signal FCLK. The command address input circuit 120 may generate the first rising command address CAR<1> by latching the first external command address ECA<1> in synchronization with a rising edge of the rising clock signal RCLK. The command address input circuit 120 may generate the second rising command address CAR<2> by latching the third external command address ECA<3> in synchronization with a rising edge of the rising clock signal RCLK. The command address input circuit 120 may generate the first falling command address CAF<1> by latching the second external command address ECA<2> in synchronization with a rising edge of the falling clock signal FCLK. The command address input circuit 120 may generate the second falling command address CAF<2> by latching the fourth external command address ECA<4> in synchronization with a rising edge of the falling clock signal FCLK. The command address input circuit 120 may output the first and second rising command addresses CAR<1:2> and the first and second falling command addresses CAF<1:2> through a through electrode TSV12. The first to fourth external command addresses ECA<1:4> may each be set as a signal including a command and an address for controlling an operation of each of the first to fourth memory chips 20, 30, 40, and 50. In an embodiment, the first to fourth external command addresses ECA<1:4> are signals that are input in series from an outside of the base chip 10. In an embodiment, the first to fourth external command addresses ECA<1:4> are signals that are input in series from an outside of the semiconductor chip 1. In an embodiment, the first to fourth external command addresses ECA<1:4> are signals that are input in series from an outside of the test circuit 210. An operation of generating, by the command address input circuit 120, the first and second rising command addresses CAR<1:2> and the first and second falling command addresses CAF<1:2> based on the first to fourth external command addresses ECA<1:4> in synchronization with the rising clock signal RCLK and the falling clock signal FCLK may be described below with reference to FIG. 5.

The data input and output circuit 130 may receive first to N-th data DATA<1:N> through a bump B3 after the start of a write operation. The data input and output circuit 130 may generate the first to N-th transfer data TD<1:N> from the first to N-th data DATA<1:N> after the start of a write operation. The data input and output circuit 130 may output the first to N-th transfer data TD<1:N> through a through electrode TSV13 after the start of a write operation. The data input and output circuit 130 may output the first to N-th transfer data TD<1:N> to the first to fourth memory chips 20, 30, 40, and 50 through the through electrode TSV13 after the start of a write operation. The data input and output circuit 130 may receive the first to N-th transfer data TD<1:N> through the through electrode TSV13 after the start of a read operation. The data input and output circuit 130 may receive the first to N-th transfer data TD<1:N> from the first to fourth memory chips 20, 30, 40, and 50 through the through electrode TSV13 after the start of a read operation. The data input and output circuit 130 may generate the first to N-th data DATA<1:N> from the first to N-th transfer data TD<1:N> after the start of a read operation. The data input and output circuit 130 may output the first to N-th data DATA<1:N> through the bump B3 after the start of a read operation.

The through electrode area 200 may include the test circuit 210. The through electrode area 200 may be set as an area including a plurality of through electrodes.

The test circuit 210 may receive the rising clock signal RCLK and the falling clock signal FCLK through the through electrode TSV11. The test circuit 210 may receive the first and second rising command addresses CAR<1:2> and the first and second falling command addresses CAF<1: 2> through the through electrode TSV12. The test circuit 210 may latch the remaining one of the first and second rising command addresses CAR<1:2> and the first and second falling command addresses CAF<1:2> as any one of the first and second rising command addresses CAR<1:2> and the first and second falling command addresses CAF<1: 2>. The test circuit 210 may generate the first and second detection signals (DT<1:2> in FIG. 6) based on the first and second rising command addresses CAR<1:2> and the first and second falling command addresses CAF<1:2> that have been latched. The test circuit 210 may detect a fail in the transmission of the first and second rising command addresses CAR<1:2> and the first and second falling command addresses CAF<1:2> by detecting the logic levels of the first and second detection signals (DT<1:2> in FIG. 6). When the first and second detection signals (DT<1:2> in FIG. 6) are different from a set value, the test circuit 210 may detect that a fail in the transmission of the first and second rising command addresses CAR<1:2> and the first and second falling command addresses CAF<1:2> has occurred. When the first and second detection signals (DT<1:2> in FIG. 6) are identical with the set value, the test circuit 210 may detect that a fail in the transmission of the first and second rising command addresses CAR<1:2> and the first and second falling command addresses CAF<1:2> has not occurred.

Figure 3:
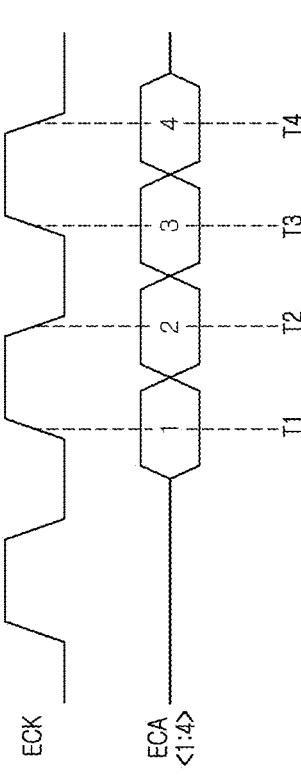
FIG. 3 is a timing diagram for describing external command addresses that are input in synchronization with an external clock signal according to an embodiment of the present disclosure.

FIG. 3 is a timing diagram for describing external command addresses that are input in synchronization with an external clock signal according to an embodiment of the present disclosure. The first to fourth external command addresses ECA<1:4> that are input in synchronization with the external clock signal ECK may be described as follows with reference to FIG. 3.

At timing T1, that is, a rising edge of the external clock signal ECK, the first external command address ECA<1> may be input.

At timing T2, that is, a falling edge of the external clock signal ECK, the second external command address ECA<2> may be input.

At timing T3, that is, a rising edge of the external clock signal ECK, the third external command address ECA<3> may be input.

At timing T4, that is, a falling edge of the external clock signal ECK, the fourth external command address ECA<4> may be input.

Figure 4:
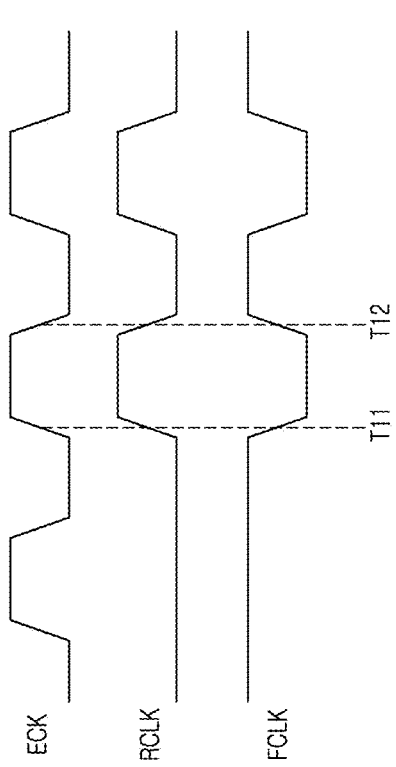
FIG. 4 is a timing diagram for describing an embodiment of an operation of a clock generation circuit that is included in the base chip illustrated in FIG. 2.

FIG. 4 is a timing diagram for describing an embodiment of an operation of the clock generation circuit that is included in the base chip illustrated in FIG. 2. An operation of generating, by the clock generation circuit 110, the rising clock signal RCLK and the falling clock signal FCLK based on the external clock signal ECK may be described as follows with reference to FIG. 4.

At timing T11, the clock generation circuit 110 may generate the rising clock signal RCLK including a pulse that is periodically generated in synchronization with a rising edge of the external clock signal ECK.

At timing T12, the clock generation circuit 110 may generate the falling clock signal FCLK including a pulse that is periodically generated in synchronization with a falling edge of the external clock signal ECK.

The rising clock signal RCLK and the falling clock signal FCLK may be generated by being periodically toggled with opposite phases.

Figure 5:
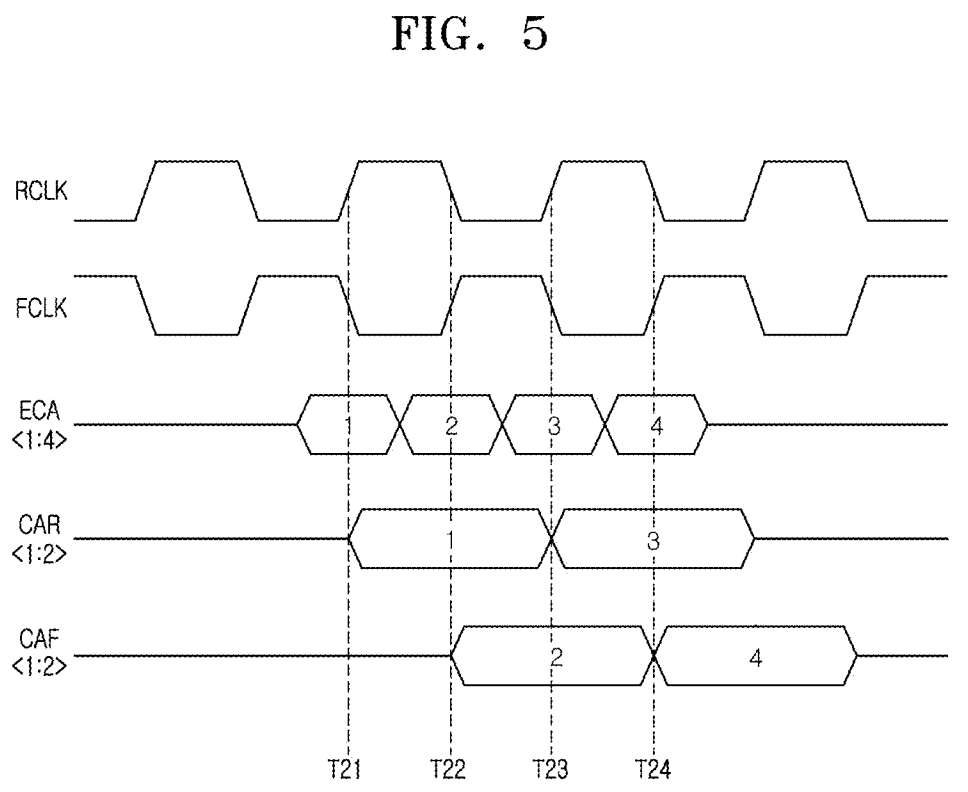

FIG. 5 is a timing diagram for describing an embodiment of an operation of the command address input circuit that is included in the base chip illustrated in FIG. 2. An operation of generating, by the command address input circuit 120, the first and second rising command addresses CAR<1:2> and the first and second falling command addresses CAF<1:2> based on the first to fourth external command addresses ECA<1:4> in synchronization with the rising clock signal RCLK and the falling clock signal FCLK may be described as follows with reference to FIG. 5.

At timing T21, the command address input circuit 120 may generate the first rising command address CAR<1> by latching the first external command address ECA<1> in synchronization with a rising edge of the rising clock signal RCLK.

At timing T22, the command address input circuit 120 may generate the first falling command address CAF<1> by latching the second external command address ECA<2> in synchronization with a rising edge of the falling clock signal FCLK.

At timing T23, the command address input circuit 120 may generate the second rising command address CAR<2> by latching the third external command address ECA<3> in synchronization with a rising edge of the rising clock signal RCLK.

At timing T24, the command address input circuit 120 may generate the second falling command address CAF<2> by latching the fourth external command address ECA<4> in synchronization with a rising edge of the falling clock signal FCLK.

Figure 6:
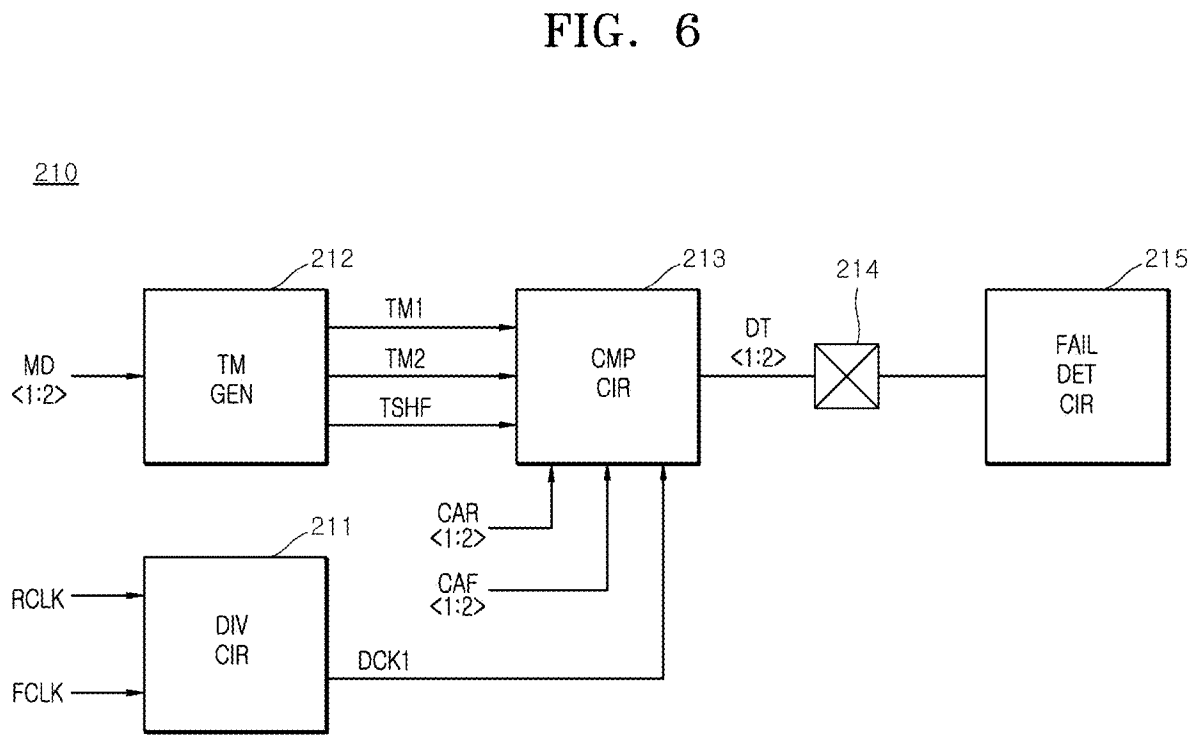

FIG. 6 is a block diagram illustrating a construction according to an embodiment of the test circuit that is included in the base chip illustrated in FIG. 2. Referring to FIG. 6, the test circuit 210 may include a division circuit (DIV CIR) 211, a test mode signal generation circuit (TM GEN) 212, a comparison circuit (CMP CIR) 213, an output pad 214, and a fail detection circuit (FAIL DET CIR) 215.

The division circuit 211 may generate a first division clock signal DCK1, a second division clock signal (DCK2 in FIG. 7), a third division clock signal (DCK3 in FIG. 7), and a fourth division clock signal (DCK4 in FIG. 7) by dividing the frequencies of the rising clock signal RCLK and the falling clock signal FCLK. The division circuit 211 may generate the first division clock signal DCK1 including a pulse that is generated in synchronization with a rising edge of the rising clock signal RCLK. The division circuit 211 may generate the first division clock signal DCK1 having a frequency that is ½ of the frequency of the rising clock signal RCLK in synchronization with a rising edge of the rising clock signal RCLK. The division circuit 211 may generate the second division clock signal (DCK2 in FIG. 7) including a pulse that is generated in synchronization with a rising edge of the falling clock signal FCLK. The division circuit 211 may generate the second division clock signal (DCK2 in FIG. 7) having a frequency that is ½ of the frequency of the falling clock signal FCLK in synchronization with a rising edge of the falling clock signal FCLK. The division circuit 211 may generate the third division clock signal (DCK3 in FIG. 7) including a pulse that is generated in synchronization with a rising edge of the rising clock signal RCLK. The division circuit 211 may generate the third division clock signal (DCK3 in FIG. 7) having a frequency that is ½ of the frequency of the rising clock signal RCLK in synchronization with a rising edge of the rising clock signal RCLK. The division circuit 211 may generate the fourth division clock signal (DCK4 in FIG. 7) including a pulse that is generated in synchronization with a rising edge of the falling clock signal FCLK. The division circuit 211 may generate the fourth division clock signal (DCK4 in FIG. 7) having a frequency that is ½ of the frequency of the falling clock signal FCLK in synchronization with a rising edge of the falling clock signal FCLK. The division circuit 211 may output the first division clock signal DCK1. The division circuit 211 has been implemented to output the first division clock signal DCK1. However, according to an embodiment, the division circuit 211 may be implemented to output any one of the second division clock signal (DCK2 in FIG. 7), the third division clock signal (DCK3 in FIG. 7), and the fourth division clock signal (DCK4 in FIG. 7). An operation of generating, by the division circuit 211, the first division clock signal DCK1, the second division clock signal (DCK2 in FIG. 7), the third division clock signal (DCK3 in FIG. 7), and the fourth division clock signal (DCK4 in FIG. 7) by dividing the frequencies of the rising clock signal RCLK and the falling clock signal FCLK may be described below with reference to FIG. 7.

The test mode signal generation circuit 212 may generate a first test mode signal TM1, a second test mode signal TM2, and a test shift signal TSHF, based on first and second mode signals MD<1:2>. The test mode signal generation circuit 212 may generate the first test mode signal TM1 that is enabled when the first mode signal MD<1> has a logic high level and the second mode signal MD<2> has a logic low level. The test mode signal generation circuit 212 may generate the second test mode signal TM2 that is disabled when the first mode signal MD<1> has a logic high level and the second mode signal MD<2> has a logic low level. The test mode signal generation circuit 212 may generate the first test mode signal TM1 that is enabled when the first mode signal MD<1> has a logic low level and the second mode signal MD<2> has a logic high level. The test mode signal generation circuit 212 may generate the second test mode signal TM2 that is enabled when the first mode signal MD<1> has a logic low level and the second mode signal MD<2> has a logic high level. The test mode signal generation circuit 212 may generate the test shift signal TSHF that is enabled when the first mode signal MD<1> has a logic high level and the second mode signal MD<2> has a logic high level. The logic levels of the first and second mode signals MD<1:2> for generating, by the test mode signal generation circuit 212, the first test mode signal TM1, the second test mode signal TM2, and the test shift signal TSHF may be variously set according to an embodiment.

The comparison circuit 213 may latch the remaining one of the first and second rising command addresses CAR<1:2> and the first and second falling command addresses CAF<1: 2> as any one of the first and second rising command addresses CAR<1:2> and the first and second falling command addresses CAF<1:2>, based on the first test mode signal TM1 and the second test mode signal TM2. The comparison circuit 213 may generate the first and second detection signals DT<1:2> based on the first and second rising command addresses CAR<1:2> and the first and second falling command addresses CAF<1:2> that have been latched, in synchronization with the first division clock signal DCK1. The comparison circuit 213 may output, to the output pad 214, the first and second detection signals DT<1: 2> that are generated in series.

The fail detection circuit 215 may detect a fail in the transmission of the first and second rising command addresses CAR<1:2> and the first and second falling command addresses CAF<1:2> by detecting the logic levels of the first and second detection signals DT<1:2>. The fail detection circuit 215 may detect that a fail in the transmission of the first and second rising command addresses CAR<1:2> and the first and second falling command addresses CAF<1:2> has occurred when the first and second detection signals DT<1:2> are different from a set value. The fail detection circuit 215 may detect that a fail in the transmission of the first and second rising command addresses CAR<1:2> and the first and second falling command addresses CAF<1:2> has not occurred when the first and second detection signals DT<1:2> are identical with the set value. A fail in the transmission of the first and second rising command addresses CAR<1:2> and the first and second falling command addresses CAF<1:2> may be set as a case in which the first and second rising command addresses CAR<1:2> and the first and second falling command addresses CAF<1:2> that are input through the through electrode (TSV12 in FIG. 2) and the first and second rising command addresses CAR<1:2> and the first and second falling command addresses CAF<1:2> that are output through the through electrode (TSV12 in FIG. 2) have different logic levels due to a fail of the through electrode (TSV12 in FIG. 2). Furthermore, a fail in the transmission of the first and second rising command addresses CAR<1:2> and the first and second falling command addresses CAF<1: 2> may be set as a case in which the first to fourth external command addresses ECA<1:4>, and the first and second rising command addresses CAR<1:2> and the first and second falling command addresses CAF<1:2> are generated to have different logic levels due to a fail of the command address input circuit 120.

Figure 7:
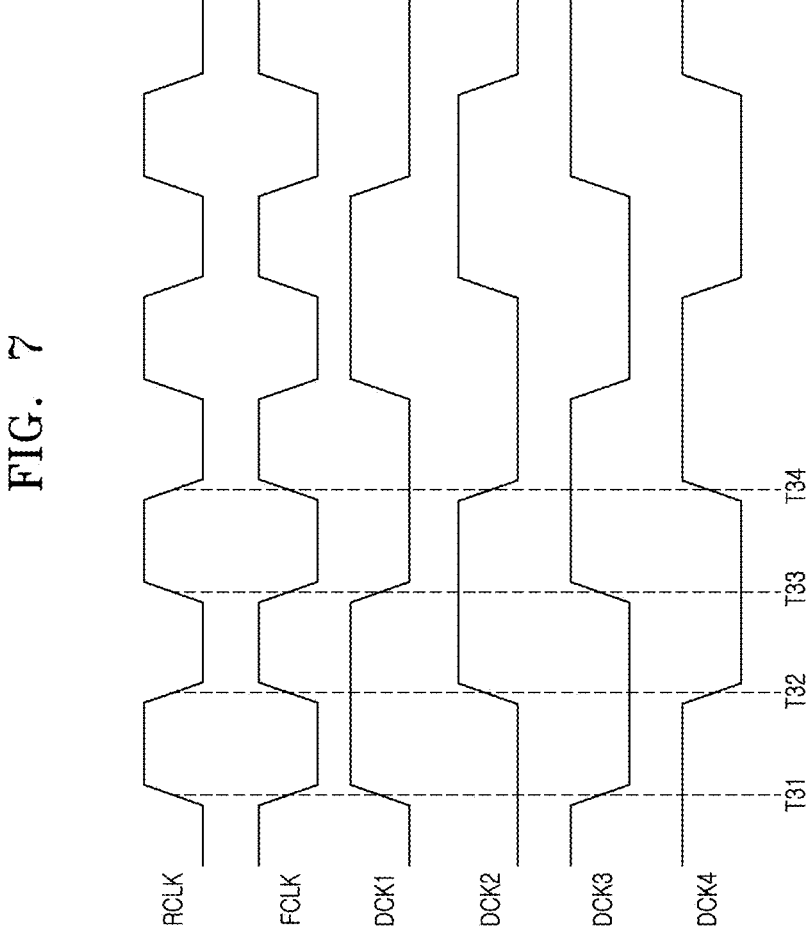
FIG. 7 is a timing diagram for describing an embodiment of an operation of a division circuit that is included in the test circuit illustrated in FIG. 6.

FIG. 7 is a timing diagram for describing an embodiment of an operation of the division circuit 211 that is included in the test circuit 210 illustrated in FIG. 6. An operation of generating, by the division circuit 211, the first division clock signal DCK1, the second division clock signal DCK2, the third division clock signal DCK3, and the fourth division clock signal DCK4 by dividing the frequencies of the rising clock signal RCLK and the falling clock signal FCLK may be described as follows with reference to FIG. 7.

At timing T31, the division circuit 211 may generate the first division clock signal DCK1 including a pulse that is generated during one cycle of the rising clock signal RCLK in synchronization with a rising edge of the rising clock signal RCLK. The division circuit 211 may generate the first division clock signal DCK1 having a frequency that is ½ of the frequency of the rising clock signal RCLK in synchronization with a rising edge of the rising clock signal RCLK.

At timing T32, the division circuit 211 may generate the second division clock signal DCK2 including a pulse that is generated during one cycle of the falling clock signal FCLK in synchronization with a rising edge of the falling clock signal FCLK. The division circuit 211 may generate the second division clock signal DCK2 having a frequency that is ½ of the frequency of the falling clock signal FCLK in synchronization with a rising edge of the falling clock signal FCLK.

At timing T33, the division circuit 211 may generate the third division clock signal DCK3 including a pulse that is generated during one cycle of the rising clock signal RCLK in synchronization with a rising edge of the rising clock signal RCLK. The division circuit 211 may generate the third division clock signal DCK3 having a frequency that is ½ of the frequency of the rising clock signal RCLK in synchronization with a rising edge of the rising clock signal RCLK.

At timing T34, the division circuit 211 may generate the fourth division clock signal DCK4 including a pulse that is generated during one cycle of the falling clock signal FCLK in synchronization with a rising edge of the falling clock signal FCLK. The division circuit 211 may generate the fourth division clock signal DCK4 having a frequency that is ½ of the frequency of the falling clock signal FCLK in synchronization with a rising edge of the falling clock signal FCLK.

The division circuit 211 may generate the first division clock signal DCK1, the second division clock signal DCK2, the third division clock signal DCK3, and the fourth division clock signal DCK4 each having a phase difference corresponding to a ½ frequency of each of the rising clock signal RCLK and the falling clock signal FCLK by dividing the frequency of each of the rising clock signal RCLK and the falling clock signal FCLK.

Figure 8:
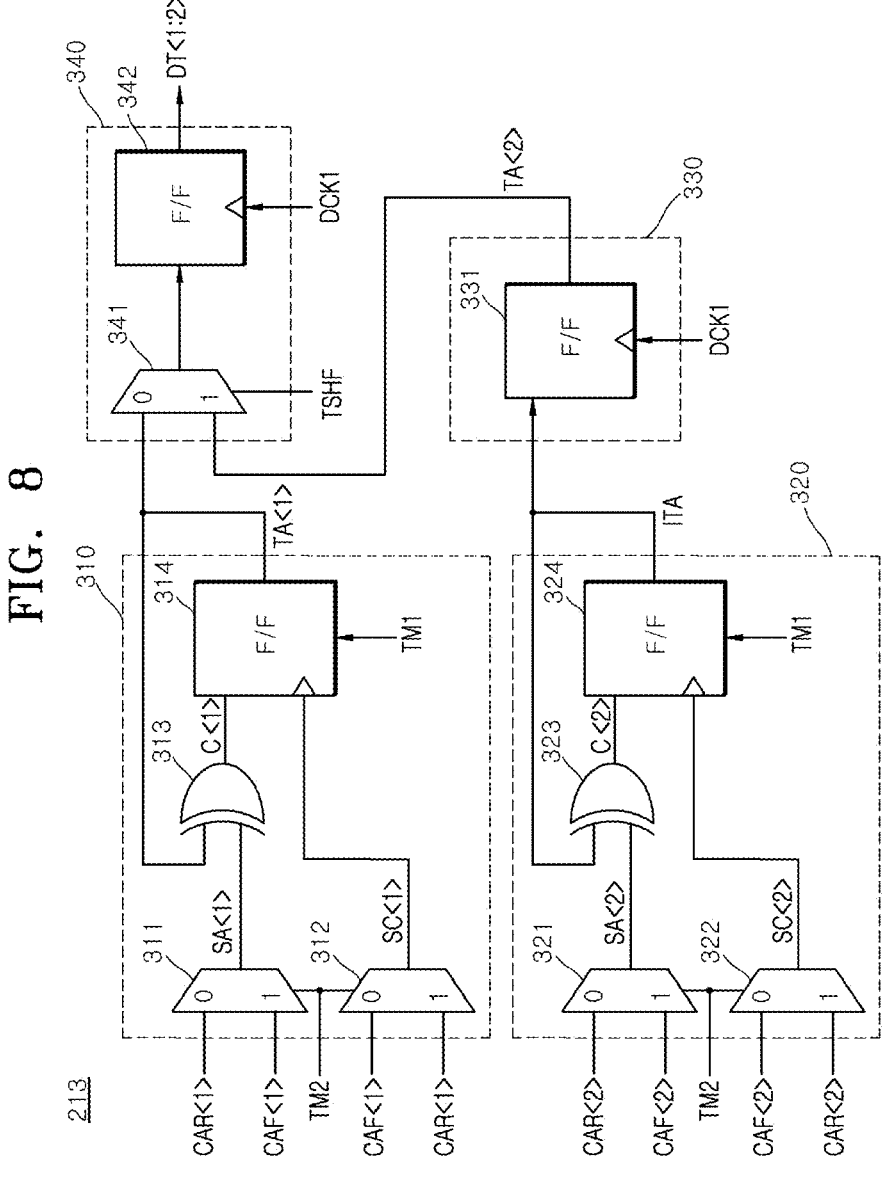
FIG. 8 is a diagram illustrating a construction according to an embodiment of a comparison circuit that is included in the test circuit illustrated in FIG. 6.

FIG. 8 is a diagram illustrating a construction according to an embodiment of the comparison circuit 213 that is included in the test circuit 210 illustrated in FIG. 6. The comparison circuit 213 may include a transfer address generation circuit 310, an internal transfer address generation circuit 320, an address transfer circuit 330, and a detection signal generation circuit 340.

The transfer address generation circuit 310 may include a multiplexer 311, a multiplexer 312, an XOR gate 313, and a flip-flop (F/F) 314. The multiplexer 311 may output the first rising command address CAR<1> as a first selection address SA<1> when the second test mode signal TM2 is disabled to a logic low level. The multiplexer 311 may output the first falling command address CAF<1> as the first selection address SA<1> when the second test mode signal TM2 is enabled to a logic high level. The multiplexer 312 may output the first falling command address CAF<1> as a first selection clock signal SC<1> when the second test mode signal TM2 is disabled to a logic low level. The multiplexer 312 may output the first rising command address CAR<1> as the first selection clock signal SC<1> when the second test mode signal TM2 is enabled to a logic high level. The XOR gate 313 may generate a first comparison signal C<1> having a logic low level when a first transfer address TA<1> and the first selection address SA<1> have the same logic level. The XOR gate 313 may generate the first comparison signal C<1> having a logic high level when the first transfer address TA<1> and the first selection address SA<1> have different logic levels. The flip-flop 314 may initialize the logic level of the first transfer address TA<1> as a logic low level when the first test mode signal TM1 is enabled to a logic high level. The flip-flop 314 may latch the first comparison signal C<1> when the first selection clock signal SC<1> transitions from a logic low level to a logic high level. The flip-flop 314 may output, as the first transfer address TA<1>, the first comparison signal C<1> that has been latched when the first selection clock signal SC<1> transitions from a logic low level to a logic high level.

The transfer address generation circuit 310 may initialize the logic level of the first transfer address TA<1> as a logic low level when the first test mode signal TM1 is enabled to a logic high level. The transfer address generation circuit 310 may generate the first selection address SA<1> from the first rising command address CAR<1> in synchronization with the first selection clock signal SC<1> that is generated from the first falling command address CAF<1> when the second test mode signal TM2 is disabled to a logic low level. The transfer address generation circuit 310 may generate the first transfer address TA<1> having a logic high level when the first selection address SA<1> and the first transfer address TA<1> have different logic levels. The transfer address generation circuit 310 may generate the first transfer address TA<1> having a logic low level when the first selection address SA<1> and the first transfer address TA<1> have the same logic level.

The internal transfer address generation circuit 320 may include a multiplexer 321, a multiplexer 322, an XOR gate 323, and a flip-flop (F/F) 324. The multiplexer 321 may output the second rising command address CAR<2> as a second selection address SA<2> when the second test mode signal TM2 is disabled to a logic low level. The multiplexer 321 may output the second falling command address CAF<2> as the second selection address SA<2> when the second test mode signal TM2 is enabled to a logic high level. The multiplexer 322 may output the second falling command address CAF<2> as a second selection clock signal SC<2> when the second test mode signal TM2 is disabled to a logic low level. The multiplexer 322 may output the second rising command address CAR<2> as the second selection clock signal SC<2> when the second test mode signal TM2 is enabled to a logic high level. The XOR gate 323 may generate a second comparison signal C<2> having a logic low level when the internal transfer address ITA and the second selection address SA<2> have the same logic level. The XOR gate 323 may generate the second comparison signal C<2> having a logic high level when an internal transfer address ITA and the second selection address SA<2> have different logic levels. The flip-flop 324 may initialize the logic level of the internal transfer address ITA as a logic low level when the first test mode signal TM1 is enabled to a logic high level. The flip-flop 324 may latch the second comparison signal C<2> when the second selection clock signal SC<2> transitions from a logic low level to a logic high level. The flip-flop 324 may output, as the internal transfer address ITA, the second comparison signal C<2> that has been latched when the second selection clock signal SC<2> transitions from a logic low level to a logic high level.

The internal transfer address generation circuit 320 may initialize the logic level of the internal transfer address ITA as a logic low level when the first test mode signal TM1 is enabled to a logic high level. The internal transfer address generation circuit 320 may generate the second selection address SA<2> from the second rising command address CAR<2> in synchronization with the second selection clock signal SC<2> that is generated from the second falling command address CAF<2> when the second test mode signal TM2 is disabled to a logic low level. The internal transfer address generation circuit 320 may generate the internal transfer address ITA having a logic high level when the second selection address SA<2> and the internal transfer address ITA have different logic levels. The internal transfer address generation circuit 320 may generate the internal transfer address ITA having a logic low level when the second selection address SA<2> and the internal transfer address ITA have the same logic level.

The address transfer circuit 330 may include a flip-flop (F/F) 331. The flip-flop 331 may latch the internal transfer address ITA when the first division clock signal DCK<1> transitions from a logic low level to a logic high level. The flip-flop 331 may output, as a second transfer address TA<2>, the internal transfer address ITA that has been latched when the first division clock signal DCK<1> transitions from a logic low level to a logic high level.

The address transfer circuit 330 may output the internal transfer address ITA as the second transfer address TA<2> in synchronization with the first division clock signal DCK<1>.

The detection signal generation circuit 340 may include a multiplexer 341 and a flip-flop (F/F) 342. The multiplexer 341 may output the first transfer address TA<1> by receiving the first transfer address TA<1> when the test shift signal TSHF is disabled to a logic low level. The multiplexer 341 may output the second transfer address TA<2> by receiving the second transfer address TA<2> when the test shift signal TSHF is enabled to a logic high level. The flip-flop 342 may latch the output signal of the multiplexer 341 when the first division clock signal DCK<1> transitions from a logic low level to a logic high level. The flip-flop 342 may output the output signal of the multiplexer 341, which has been latched when the first division clock signal DCK<1> transitions from a logic low level to a logic high level, as the first and second detection signals DT<1:2>.

The detection signal generation circuit 340 may output the first transfer address TA<1> as the first detection signal DT<1> when the test shift signal TSHF is disabled to a logic low level. The detection signal generation circuit 340 may output the second transfer address TA<2> as the second detection signal DT<2> when the test shift signal TSHF is enabled to a logic high level. The first and second detection signals DT<1:2> may be output in series through the output pad 214.

FIG. 9 is a table for describing an operation of detecting, by the semiconductor chip according to an embodiment of the present disclosure, a fail in the transmission of a command address. The operation of detecting a fail in the transmission of the command address may be described, but a case in which the second test mode signal TM2 is disabled and a set value is set as "L,L" may be described as follows as an example with reference to FIG. 9.

Prior to a description, the set value may mean a case in which the first external command address ECA<1> having a logic low level L, the second external command address ECA<2> having a logic high level H, the third external command address ECA<3> having a logic low level L, and the fourth external command address ECA<4> having a logic high level H are input.

First, a case (PASS) in which a fail in the transmission of the first and second rising command addresses CAR<1:2> and the first and second falling command addresses CAF<1: 2> is not present may be described as follows as an example.

The command address input circuit 120 may generate the first rising command address CAR<1> having a logic low level L, the second rising command address CAR<2> having a logic low level L, the first falling command address CAF<1> having a logic high level H, and the second falling command address CAF<2> having a logic high level H, based on the first to fourth external command addresses ECA<1:4> in synchronization with the rising clock signal RCLK and the falling clock signal FCLK.

The test mode signal generation circuit 212 of the test circuit 210 may generate the first test mode signal TM1 that is enabled when the first mode signal MD<1> has a logic high level and the second mode signal MD<2> has a logic low level. The test mode signal generation circuit 212 may generate the second test mode signal TM2 that is disabled when the first mode signal MD<1> has a logic high level and the second mode signal MD<2> has a logic low level.

The comparison circuit 213 of the test circuit 210 may generate the first and second selection clock signals SC<1: 2> from the first and second falling command addresses CAF<1:2> based on the first test mode signal TM1 and the second test mode signal TM2. The comparison circuit 213 may generate the first detection signal DT<1> having a logic low level L from the first rising command address CAR<1> having a logic low level L in synchronization with the first selection clock signal SC<1>. The comparison circuit 213 may generate the second detection signal DT<2> having a logic low level L from the second rising command address CAR<2> having a logic low level L in synchronization with the second selection clock signal SC<2>.

The fail detection circuit 215 may detect that a fail in the transmission of the first and second rising command addresses CAR<1:2> and the first and second falling command addresses CAF<1:2> has not occurred (PASS) when the first and second detection signals DT<1:2> are identical with the set value "L,L".

Next, a case (FAIL) in which a fail in the transmission of the first and second rising command addresses CAR<1:2> and the first and second falling command addresses CAF<1: 2> occurs may be described as follows as an example.

The command address input circuit 120 may generate the first rising command address CAR<1> having a logic low level L, the second rising command address CAR<2> having a logic low level L, the first falling command address CAF<1> having a logic high level H, and the second falling command address CAF<2> having a logic high level H, based on the first to fourth external command addresses ECA<1:4> in synchronization with the rising clock signal RCLK and the falling clock signal FCLK.

The test mode signal generation circuit 212 of the test circuit 210 may generate the first test mode signal TM1 that is enabled when the first mode signal MD<1> has a logic high level and the second mode signal MD<2> has a logic low level. The test mode signal generation circuit 212 may generate the second test mode signal TM2 that is disabled when the first mode signal MD<1> has a logic high level and the second mode signal MD<2> has a logic low level.

The comparison circuit 213 of the test circuit 210 may generate the first and second selection clock signals SC<1: 2> from the first and second falling command addresses CAF<1:2> based on the first test mode signal TM1 and the second test mode signal TM2. The comparison circuit 213 may generate the first detection signal DT<1> having a logic low level L from the first rising command address CAR<1> having a logic low level L in synchronization with the first selection clock signal SC<1>. The comparison circuit 213 may generate the second detection signal DT<2> having a logic high level H from the second rising command address CAR<2> having a logic low level L in synchronization with the second selection clock signal SC<2>.

The fail detection circuit 215 may detect that a fail in the transmission of the first and second rising command addresses CAR<1:2> and the first and second falling command addresses CAF<1:2> has occurred (FAIL) when the first and second detection signals DT<1:2> are different from the set value "L,L".

The semiconductor chip 1 according to the embodiment of the present disclosure may detect a fail in the transmission of a command address that is output through a signal path. The semiconductor chip 1 may generate the detection signals DT<1:2> for detecting a fail in the transmission of the rising command addresses CAR<1:2> and the falling command addresses CAF<1:2> by latching the remaining one of the rising command addresses CAR<1:2> and the falling command addresses CAF<1:2> as any one of the rising command addresses CAR<1:2> and the falling command addresses CAF<1:2> that are output in synchronization with the different clock signals RCLK and FCLK. The semiconductor chip 1 may detect a fail in the transmission of the rising command addresses CAR<1:2> and the falling command addresses CAF<1:2> when the logic levels of the rising command addresses CAR<1:2> and the falling command addresses CAF<1:2> that are output in synchronization with the different clock signals RCLK and FCLK are different from a set value.

Figure 10:
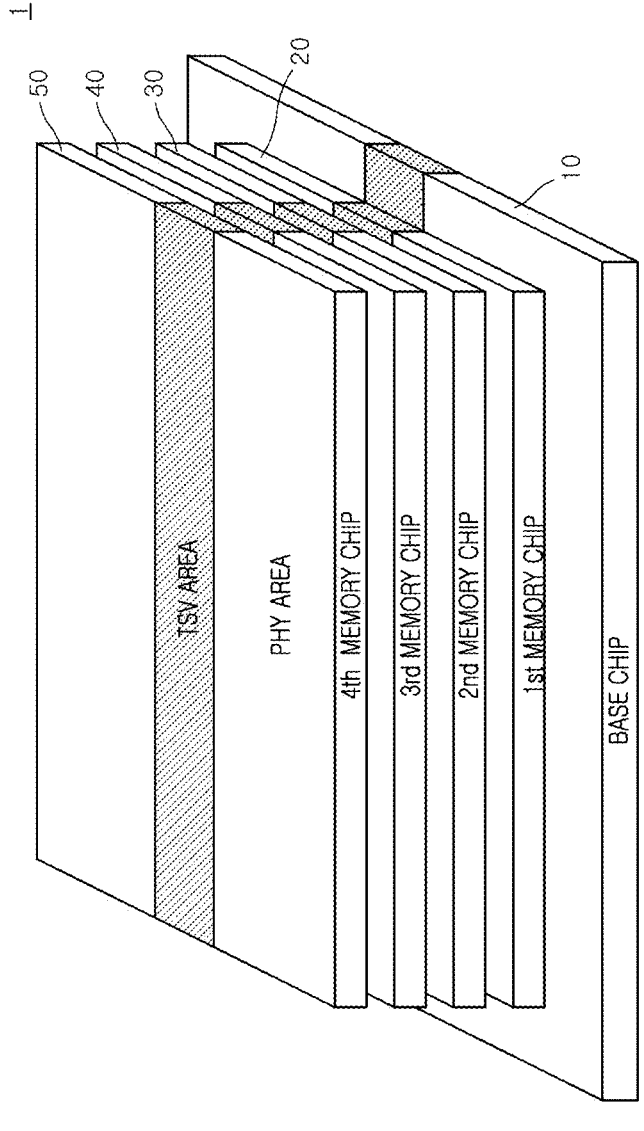
FIG. 10 is a diagram for describing a three-dimensional structure of the semiconductor chip according to an embodiment of the present disclosure.

FIG. 10 is a diagram for describing a three-dimensional structure of the semiconductor chip according to an embodiment of the present disclosure.

The base chip 10 may include an interface area PHY AREA and a through electrode area TSV AREA. The through electrode area TSV AREA (indicated by dotted line) may be disposed at the center of the base chip 10. The interface area PHY AREA may be disposed on the left and right sides centering around the through electrode area TSV AREA (indicated by the line with the dots in it).

The first memory chip 20 may be vertically stacked on the base chip 10.

The first memory chip 20 may include an interface area PHY AREA and a through electrode area TSV AREA. The through electrode area TSV AREA (indicated by the line with the dots in it) may be disposed at the center of the first memory chip 20. The interface area PHY AREA may be disposed on the left and right sides centering around the through electrode area TSV AREA (indicated by the line with the dots in it).

The second memory chip 30 may be vertically stacked on the first memory chip 20.

The second memory chip 30 may include an interface area PHY AREA and a through electrode area TSV AREA. The through electrode area TSV AREA (indicated by the line with the dots in it) may be disposed at the center of the second memory chip 30. The interface area PHY AREA may be disposed on the left and right sides centering around the through electrode area TSV AREA (indicated by the line with the dots in it).

The third memory chip 40 may be vertically stacked on the second memory chip 30.

The third memory chip 40 may include an interface area PHY AREA and a through electrode area TSV AREA. The through electrode area TSV AREA (indicated by the line with the dots in it) may be disposed at the center of the third memory chip 40. The interface area PHY AREA may be disposed on the left and right sides centering around the through electrode area TSV AREA (indicated by the line with the dots in it).

The fourth memory chip 50 may be vertically stacked on the third memory chip 40.

The fourth memory chip 50 may include an interface area PHY AREA and a through electrode area TSV AREA. The through electrode area TSV AREA (indicated by the line with the dots in it) may be disposed at the center of the fourth memory chip 50. The interface area PHY AREA may be disposed on the left and right sides centering around the through electrode area TSV AREA (indicated by the line with the dots in it).

Figure 11:
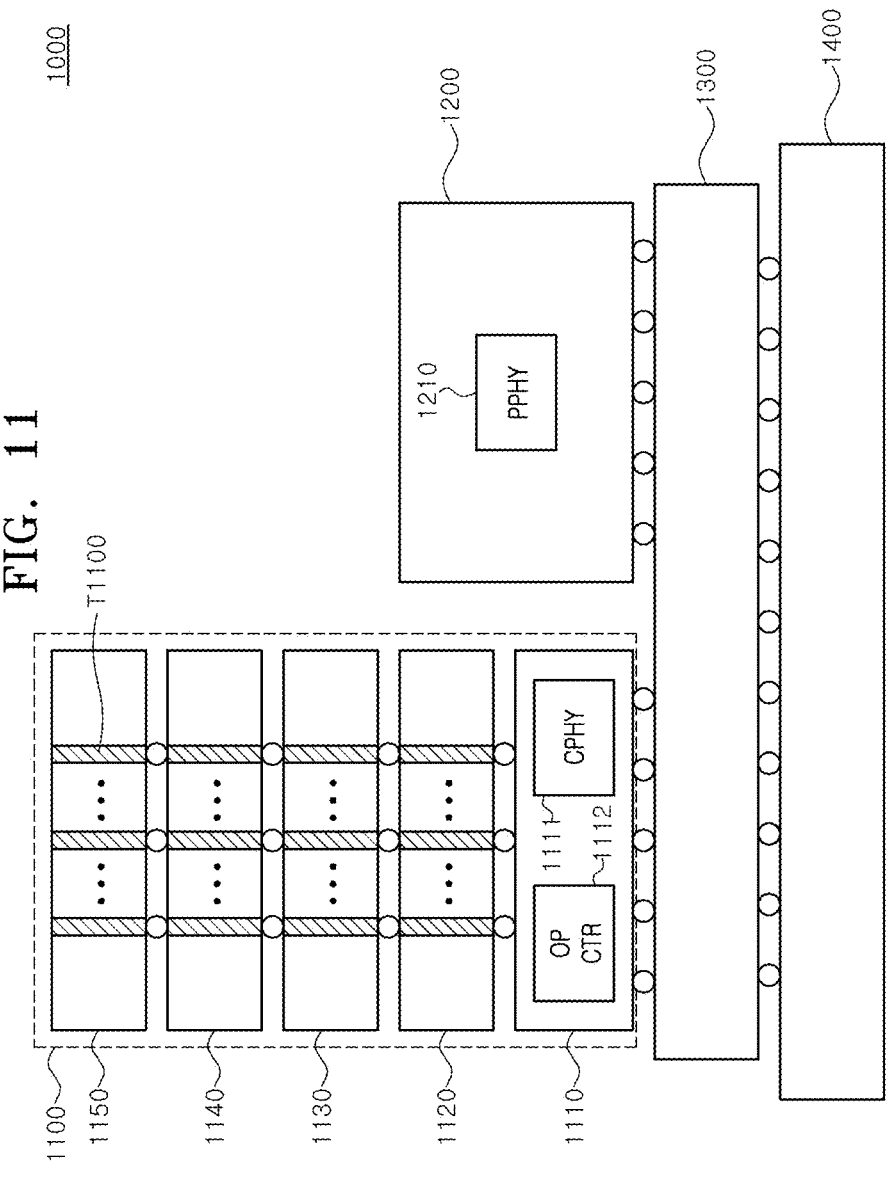
FIG. 11 is a diagram illustrating a construction according to an embodiment of an electronic system to which the semiconductor chip illustrated in FIGS. 1 to 10 has been applied.

FIG. 11 is a block diagram illustrating a construction of a stack memory system 1000 according to an example of the present disclosure. As illustrated in FIG. 11, the stack memory system 1000 may include a semiconductor chip 1100, a processor 1200, an interposer 1300, and a substrate 1400.

The interposer 1300 may be formed over the substrate 1400. The semiconductor chip 1100 and the processor 1200 may be formed over the interposer 1300. The interposer 1300 may be used to electrically connect the substrate 1400, the semiconductor chip 1100, and the processor 1200. In an embodiment, the substrate 1400, the semiconductor chip 1100, and the processor 1200 may be electrically connected by using the interposer 1300 including wires that are variously formed because differences between the pitches of the substrate 1400, the semiconductor chip 1100 and the processor 1200 are great.

The processor 1200 may include a processor interface circuit (PPHY) 1210. The processor 1200 may apply, to the semiconductor chip 1100, a signal including a command and an address for controlling various internal operations of the semiconductor chip 1100 through the processor interface circuit 1210, and may receive data from the semiconductor chip 1100 through the processor interface circuit 1210.

The semiconductor chip 1100 may include a base chip 1110 and memory chips 1120, 1130, 1140, and 1150. The semiconductor chip 1100 may be implemented as the semiconductor chip 1 illustrated in FIG. 1.

The memory chips 1120, 1130, 1140, and 1150 may be sequentially stacked on the base chip 1110, and may receive various signals from the base chip 1110 through electrodes T1100.

The base chip 1110 may include a core interface circuit (CPHY) 1111 and an operation control circuit (OP CTR) 1112. The core interface circuit 1111 may be set to communicate with the processor interface circuit 1112, and may transmit a signal, including a command and an address that are received from the processor 1200, to the operation control circuit 1112 and apply data that are generated by the operation control circuit 1112 to the processor 1200. The core interface circuit 1111 may be implemented as the test signal generation circuit 11 and the chip ID generation circuit 12 illustrated in FIG. 2. The operation control circuit 1112 may be implemented as the test signal generation circuit 11, the logic test circuit 12, and the fail detection circuit 13 illustrated in FIG. 2.

The semiconductor chip 1100 may detect a fail in the transmission of a command address that is output through a plurality of signal paths that are connected to the plurality of memory chips 1120, 1130, 1140, and 1150. The semiconductor chip 1100 may generate the detection signals DT<1:2> for detecting a fail in the transmission of the rising command addresses CAR<1:2> and the falling command addresses CAF<1:2> by latching the remaining one of the rising command addresses CAR<1:2> and the falling command addresses CAF<1:2> as any one of the rising command addresses CAR<1:2> and the falling command addresses CAF<1:2> that are output in synchronization with the different clock signals RCLK and FCLK. The semiconductor chip 1100 may detect a fail in the transmission of the rising command addresses CAR<1:2> and the falling command addresses CAF<1:2> when the logic levels of the rising command addresses CAR<1:2> and the falling command addresses CAF<1:2> that are output in synchronization with the different clock signals RCLK and FCLK are different from a set value.

The embodiments of the present disclosure have been described so far. A person having ordinary knowledge in the art to which the description pertains will understand that the embodiments may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A semiconductor chip comprising:
a command address input circuit configured to receive an external command address to generate a rising command address and a falling command address and configured to output the rising command address and the falling command address to a through electrode; and
a test circuit configured to generate a detection signal by latching a remaining one of the rising command address and the falling command address as any one of the rising command address and the falling command address that are output in synchronization with rising and falling clock signals and configured to detect a fail in a transmission of the rising command address and the falling command address by detecting a logic level of the detection signal.

2. The semiconductor chip of claim 1, wherein:
the command address input circuit is included in an interface area, and
the test circuit is included in a through electrode area comprising a through electrode.

3. The semiconductor chip of claim 1, wherein:
the command address input circuit generates the rising command address by latching the external command address in synchronization with the rising clock signal, and
the command address input circuit generates the falling command address by latching the external command address in synchronization with the falling clock signal.

4. The semiconductor chip of claim 3, wherein the rising clock signal and the falling clock signal are signals that are periodically toggled with opposite phases.

5. The semiconductor chip of claim 1, wherein the test circuit generates the detection signal by latching the falling command address as the rising command address or generates the detection signal by latching the rising command address as the falling command address.

6. The semiconductor chip of claim 1, wherein the test circuit comprises:
a test mode signal generation circuit configured to generate first and second test mode signals based on a mode signal;
a transfer address generation circuit configured to initialize a transfer address based on the first test mode signal, configured to generate a selection clock signal from any one of the rising command address and the falling command address based on the second test mode signal, configured to generate a transfer address by latching a remaining one of the rising command address and the falling command address in synchronization with the selection clock signal, and configured to generate the transfer address based on the selection address;
a detection signal generation circuit configured to output the transfer address as the detection signal in synchronization with a division clock signal; and a fail detection circuit configured to detect the fail in the transmission of the rising command address and the falling command address by detecting the logic level of the detection signal.

7. The semiconductor chip of claim 6, wherein the transfer address generation circuit
generates the selection clock signal from the falling command address when the second test mode signal is disabled, and
generates the transfer address by latching the rising command address in synchronization with the selection clock signal.

8. The semiconductor chip of claim 6, wherein the transfer address generation circuit
generates the selection clock signal from the rising command address when the second test mode signal is enabled, and
generates the transfer address by latching the falling command address in synchronization with the selection clock signal.

9. A semiconductor chip comprising:
a command address input circuit configured to generate first and second rising command addresses and first and second falling command addresses by receiving first to fourth external command addresses and configured to output the first and second rising command addresses and the first and second falling command addresses to a through electrode; and
a test circuit configured to generate first and second detection signals by latching a remaining one of the first and second rising command addresses and the first and second falling command addresses as any one of the first and second rising command addresses and the first and second falling command addresses that are output in synchronization with rising and falling clock signals and configured to detect a fail in a transmission of the first and second rising command addresses and the first and second falling command addresses when the first and second detection signals are different from a set value.

10. The semiconductor chip of claim 9, wherein the first to fourth external command addresses are signals that are input in series from outside the test circuit.

11. The semiconductor chip of claim 9, wherein:
the command address input circuit is included in an interface area, and
the test circuit is included in a through electrode area comprising the through electrode.

12. The semiconductor chip of claim 9, wherein:
the command address input circuit generates the first and second rising command addresses from the first and third external command addresses in synchronization with a rising clock signal, and
the command address input circuit generates the first and second falling command addresses from the second and fourth external command addresses in synchronization with a falling clock signal.

13. The semiconductor chip of claim 9, wherein the test circuit comprises:
a test mode signal generation circuit configured to generate first and second test mode signals and a test shift signal based on a mode signal;
a comparison circuit configured to generate first and second transfer addresses by latching the remaining one of the first and second rising command addresses and the first and second falling command addresses as any one of the first and second rising command addresses and the first and second falling command addresses based on the first and second test mode signals and configured to output the first and second transfer addresses as the first and second detection signals through an output pad by serializing the first and second transfer addresses based on a division clock signal and the test shift signal; and a fail detection circuit configured to detect the fail in the transmission of the first and second rising command addresses and the first and second falling command addresses by detecting logic levels of the first and second detection signals.

14. The semiconductor chip of claim 13, wherein the comparison circuit comprises:

a transfer address generation circuit configured to initialize the first transfer address based on the first test mode signal, configured to generate a first selection clock signal from any one of the first rising command address and the first falling command address based on the second test mode signal, configured to generate a first selection address by latching a remaining one of the first rising command address and the first falling command address in synchronization with the first selection clock signal, and configured to generate the first transfer address based on the first selection address;

an internal transfer address generation circuit configured to initialize an internal transfer address based on the first test mode signal, configured to generate a second selection clock signal from any one of the second rising command address and the second falling command address based on the second test mode signal, configured to generate a second selection address by latching a remaining one of the second rising command address and the second falling command address in synchronization with the second selection clock signal, and configured to generate the internal transfer address based on the second selection address;

an address transfer circuit configured to output the internal transfer address as the second transfer address in synchronization with the division clock signal; and a detection signal generation circuit configured to output the first and second transfer addresses as the first and second detection signals by serializing the first and second transfer addresses based on the test shift signal.

15. The semiconductor chip of claim 14, wherein:

the transfer address generation circuit generates the first selection clock signal from the first falling command address when the second test mode signal is disabled and generates the first selection address by latching the first rising command address in synchronization with the first selection clock signal, and the transfer address generation circuit generates the first selection clock signal from the first rising command address when the second test mode signal is enabled and generates the first selection address by latching the first falling command address in synchronization with the first selection clock signal.

16. The semiconductor chip of claim 14, wherein:

the internal transfer address generation circuit generates the second selection clock signal from the second falling command address when the second test mode signal is disabled and generates the second selection address by latching the second rising command address in synchronization with the second selection clock signal, and the internal transfer address generation circuit generates the second selection clock signal from the second rising command address when the second test mode signal is enabled and generates the second selection address by latching the second falling command address in synchronization with the second selection clock signal.

17. The semiconductor chip of claim 14, wherein:

the detection signal generation circuit outputs the first transfer address as the first detection signal in synchronization with the division clock signal when the test shift signal is disabled, and the detection signal generation circuit outputs the second transfer address as the second detection signal in synchronization with the division clock signal when the test shift signal is enabled.

18. The semiconductor chip of claim 14, further comprising a division circuit configured to generate the division clock signal by dividing frequencies of a rising clock signal and a falling clock signal.

19. The semiconductor chip of claim 18, wherein the rising clock signal and the falling clock signal are signals that are periodically toggled with opposite phases.

20. The semiconductor chip of claim 18, wherein the division clock signal is generated to have a frequency that is substantially half of the frequency of each of the rising clock signal and the falling clock signal.

* * * * *